US008199250B2

(12) United States Patent
Kim et al.

(10) Patent No.: US 8,199,250 B2
(45) Date of Patent: Jun. 12, 2012

(54) CAMERA MODULE PACKAGE (75) Inventors: Jung Sik Kim, Gyunggi-do (KR); Ju Chul Kim, Gyunggi-do (KR); Ick Chan Shim, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 396 days.

(21) Appl. No.: 11/790,664

(22) Filed: Apr. 26, 2007

(65) Prior Publication Data

US 2007/0253697 A1 Nov. 1, 2007

(30) Foreign Application Priority Data

Apr. 27, 2006 (KR) .................. 10-2006-0038267

(51) Int. Cl.
*H04N 5/225* (2006.01)
(52) U.S. Cl. ........ 348/374; 348/294; 348/340; 348/373; 250/208.1; 257/433
(58) Field of Classification Search .................. None
See application file for complete search history.

(56) References Cited

U.S. PATENT DOCUMENTS

| 6,476,417 | B2 | 11/2002 | Honda et al. | |
|---|---|---|---|---|
| 2004/0056971 | A1* | 3/2004 | Yang et al. | 348/294 |
| 2004/0069998 | A1 | 4/2004 | Harazono | |
| 2004/0095501 | A1 | 5/2004 | Aizawa et al. | |
| 2004/0189854 | A1* | 9/2004 | Tsukamoto et al. | 348/340 |
| 2005/0161587 | A1* | 7/2005 | Mihara et al. | 250/214 R |
| 2005/0163016 | A1* | 7/2005 | Kimura | 369/112.01 |
| 2005/0200012 | A1* | 9/2005 | Kinsman | 257/737 |
| 2005/0285973 | A1* | 12/2005 | Singh et al. | 348/374 |
| 2006/0181633 | A1* | 8/2006 | Seo | 348/340 |
| 2006/0234767 | A1 | 10/2006 | Nishikawa et al. | |
| 2007/0069395 | A1* | 3/2007 | Kim et al. | 257/780 |
| 2007/0122146 | A1* | 5/2007 | Ryu | 396/529 |
| 2007/0146534 | A1* | 6/2007 | Kim et al. | 348/340 |
| 2007/0217786 | A1* | 9/2007 | Cho et al. | 396/542 |

FOREIGN PATENT DOCUMENTS

| JP | 2003-319216 | 7/2003 |
|---|---|---|
| JP | 2003-244508 | 8/2003 |
| KR | 10-2006-0003887 | 1/2006 |
| WO | WO 2005/031878 | 4/2005 |

OTHER PUBLICATIONS

Chinese Patent Office Action, mailed May 23, 2008 and issued in corresponding Chinese Patent Application No. 2007101047626.
Office Action issued in corresponding Korean Patent Application No. 10-2006-0038267, on Jun. 28, 2007.
UK Intellectual Property Office Search Report, issued in corresponding UK Patent Application No. GB0708074.0, Aug. 24, 2007.

* cited by examiner

*Primary Examiner* — David Ometz
*Assistant Examiner* — Dwight C Tejano (57) ABSTRACT

A camera module package. A housing is provided with a lens barrel having at least one lens contained therein. At least one IR filter is also provided in the housing. A board, which is assembled to the housing, has at least one reinforcement material stacked thereon and at least one passive device mounted thereon. An image sensor is assembled to a lower surface of the board with its image region exposed through a window of the board. The present invention prevents contamination by an adhesive spreading over outer periphery of the board during flip-chip bonding of the board and the sensor, increases the rigidity of the board to prevent damage to the board during the assembly into the housing, and promotes miniaturization of the module.

5 Claims, 6 Drawing Sheets

PRIOR ART

FIG. 1

PRIOR ART

CAMERA MODULE PACKAGE

CLAIM OF PRIORITY

This application claims the benefit of Korean Patent Application No. 2006-0038267 filed on Apr. 27, 2006, in the Korean Intellectual Property Office, the disclosure of which is incorporated herein by reference.

BACKGROUND OF THE INVENTION

1. Field of the Invention

The present invention relates to a camera module package and, more particularly, to a camera module package which prevents contamination caused by spreading of an adhesive during flip-chip bonding, increases the rigidity of a board to prevent damage to the board during assembly into a housing, and accommodates miniaturization.

2. Description of the Related Art

Currently, numerous mobile phone terminal manufacturers are developing and manufacturing mobile phones with camera module packages mounted therein, and such camera module packages mounted in the mobile phones are developed into various types according to the components, packaging methods, etc.

In general, camera module packages can be mainly classified into types including Chip on Film (COF), Chip on Board (COB) and Chip Scale Package (CSP), and the recent development trend of the camera module package is focused on high pixel, multi-function, miniaturization and low costs.

Figure 1:
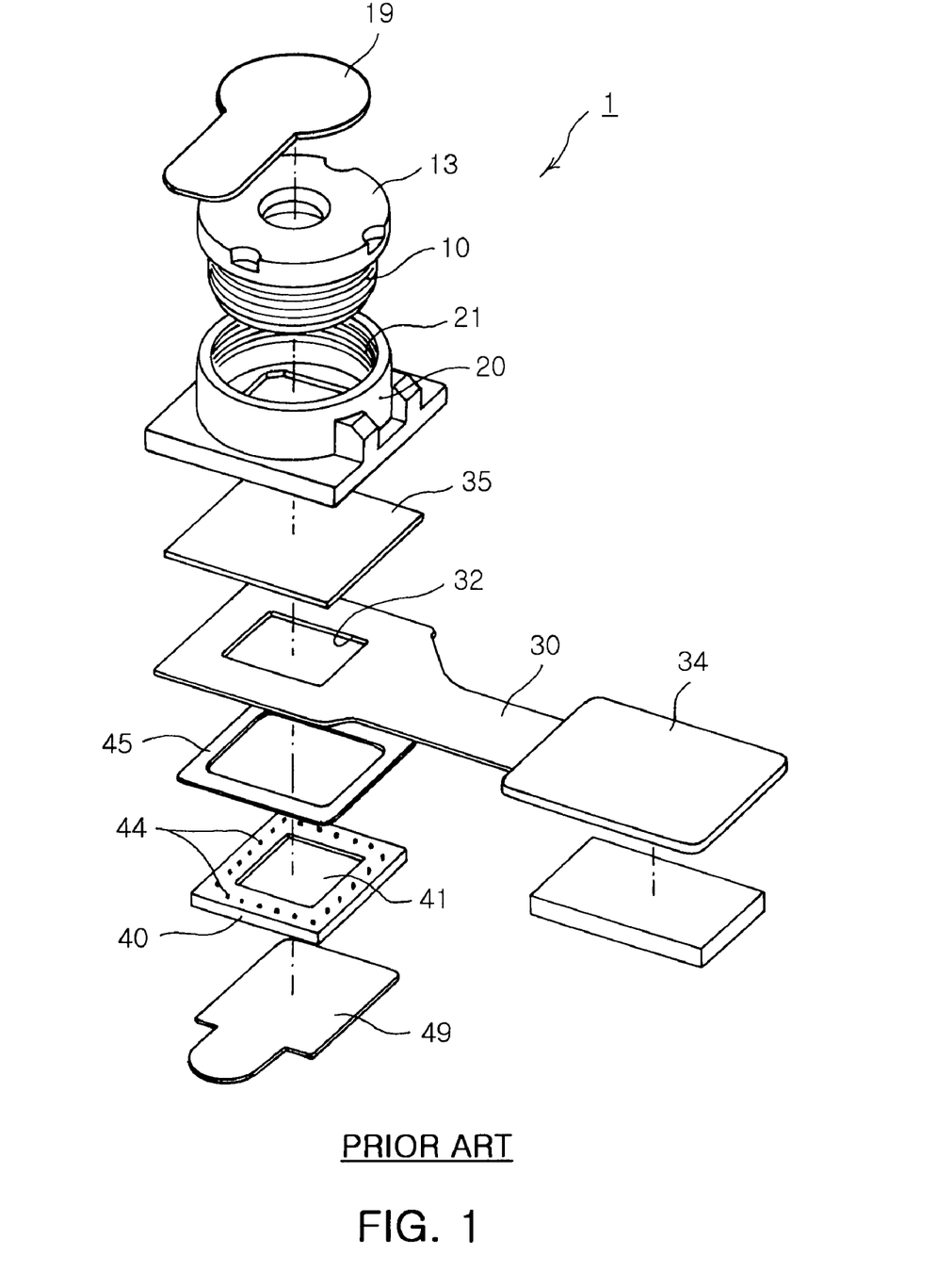
FIG. 1 is an exploded perspective view illustrating a general camera module package.
Figure 2:
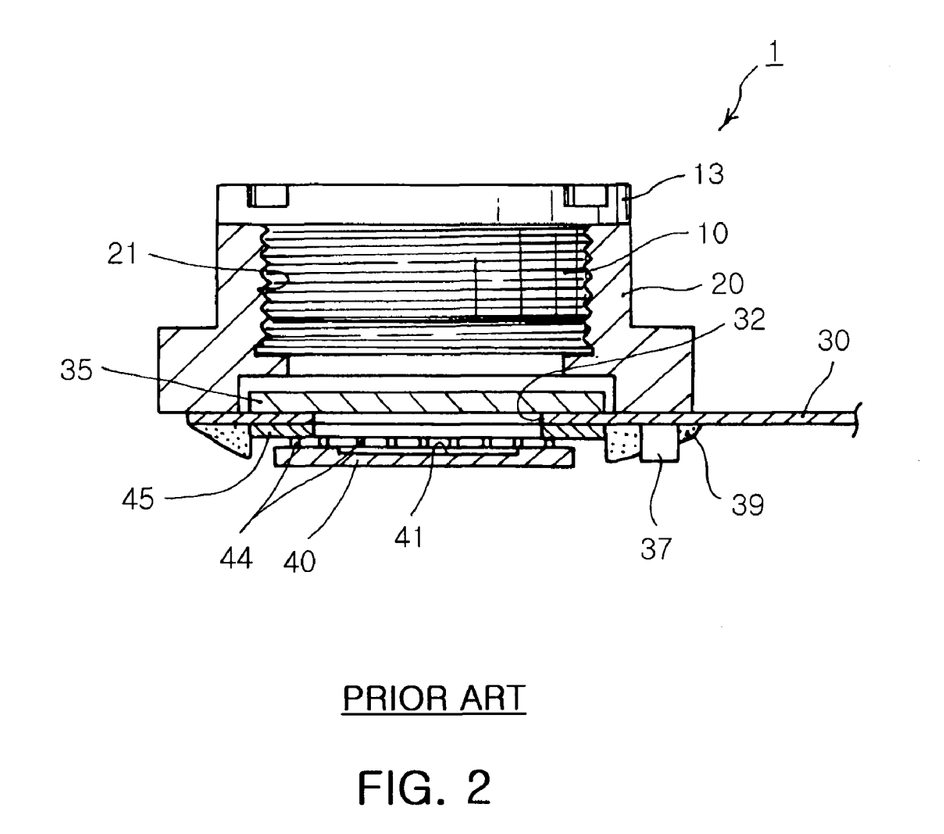
FIG. 2 is a longitudinal sectional view illustrating the general camera module package.

FIG. 1 is an exploded perspective view illustrating a general camera module package, and FIG. 2 is a longitudinal sectional view illustrating the general camera module package.

As shown in FIGS. 1 and 2, the camera module package 1 includes a lens barrel 10, a housing 20, a board 30 and an image sensor 40.

The lens barrel 10 is a hollow with a lens (not shown) disposed in an inner space thereof, has male threads formed on an outer surface thereof, and has a cap 13 assembled onto an upper end thereof.

There may be at least one lens provided in the lens barrel 10 according to the function and capacity of the desired camera module package.

The housing 20 has an opening 21 for accommodating the lens barrel 10, and the opening 21 has female threads formed on an inner circumferential surface thereof. The female threads of the opening 21 are threadly engaged with the male threads of the lens barrel 10.

With this thread engagement, the lens barrel 10 is assembled movable in an optical axis direction into the housing 20 fixed in a position.

The board 30 is a Flexible Printed Circuit Board (FPCB) attached on a lower surface of the housing 20. The board has a window 32 formed at one side to expose an image region 41 of the image sensor 40, and has a connector 34 formed at the other side for electrical connection with an unillustrated display means.

The image sensor 40 is an image pick-up device having the image region 41 where an image of an object passed through the lens of the lens barrel 10 is formed. The image sensor 40 is flip-chip bonded to a lower surface of the board 30 via an adhesive 45 like an Anisotropic Conductive Film (ACF) or a Non-Conductive Paste (NCP).

A plurality of bump pads 44 provided on an upper surface of the image sensor 40 are electrically connected to connection terminals (not shown) of the board 30 via an adhesive 45 covering the portion of the image sensor 40 excluding the image region 41.

A filter 35 is disposed above the board 30 to filter ultraviolet rays and to prevent foreign materials from falling down to the image sensor 40. Also, at least one passive device 37 such as a multi-layer ceramic capacitor can be disposed on a lower surface of the board 30.

The outer peripheral portion of the image sensor 40 is sealed off by a filler 39 applied after bonding the housing 20 with the board 30.

In FIG. 1, an unexplained reference numeral 19 denotes a tape attached on the lens barrel 10 to protect the lens, and another unexplained reference numeral 49 denotes a tape attached on a lower surface of the image sensor 40 to protect the image sensor 40.

However, in such a conventional camera module package 1, a packaged assembly including the filter 35, the board 30 and the image sensor 40 is bonded to a lower surface of the housing 20, resulting in a large overall height, and the passive device 37 is disposed at an outer side of the board from the image sensor 40 to result in a large width, limiting miniaturization of an apparatus adopting the package.

In the meantime, as a way to reduce the height as well as the width of the package 1, the board 30 with the image sensor 40 flip-chip bonded thereon can be disposed inside the housing.

However, in this conventional technology, while the substrate 30 is being inserted into the housing 20, the board 30, which has a small thickness and low rigidity, comes in contact with an inner surface of the housing 20 at an outer peripheral portion thereof, and becomes damaged.

Furthermore, during flip-chip bonding of the image sensor 40 to a lower surface of the board 30 via the adhesive 45, the adhesive 45 spreads over outer peripheral portions of the board, further hindering the process of inserting the board for assembly into the housing.

SUMMARY OF THE INVENTION

The present invention has been made to solve the foregoing problems of the prior art and therefore an aspect of the present invention is to provide a camera module package, which prevents contamination by an adhesive spreading over outer peripheral portions of a board during flip-chip bonding between the board and a sensor, increases the rigidity of the board to prevent damage to the board during assembly with a housing, and accommodates miniaturization.

According to an aspect of the invention, the invention provides a camera module package, which includes a housing; a lens barrel assembled to the housing and having at least one lens therein; at least one infrared filter disposed in the housing; a board disposed in the housing with at least one reinforcement material stacked thereon and at least one passive device mounted thereon; and an image sensor assembled to a lower surface of the board with an image region thereof exposed through a window formed at a side of the board.

Preferably, the reinforcement material is composed of an adhesive layer, a cover layer and a polyimide layer formed subsequently in an order on an upper surface of the board.

Preferably, the reinforcement material has a recess formed therein, and the passive device is mounted on an exposed plating pattern by a solder inside the recess.

More preferably, a depth of the groove is adjusted by varying a thickness of the reinforcement material to such a degree that the solder is contained in the recess as the solder is applied to cover the plating pattern on the board during solder masking.

Preferably, an inner surface of the housing is spaced with an interval from an end surface of the board.

Preferably, an outer peripheral portion of the image sensor is positioned more inward than an outer peripheral portion of the board.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 3:
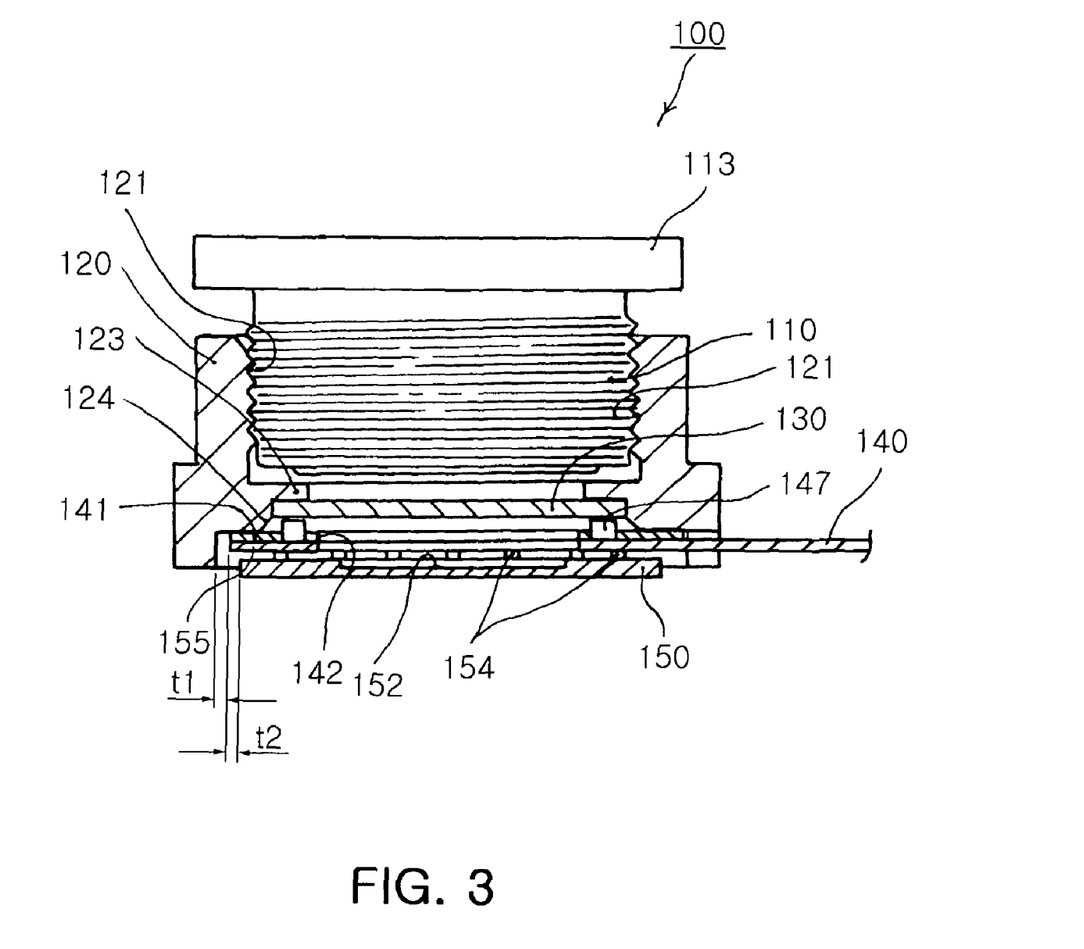
FIG. 3 is an exploded perspective view illustrating a camera module package according to an embodiment of the present invention.
Figure 4:
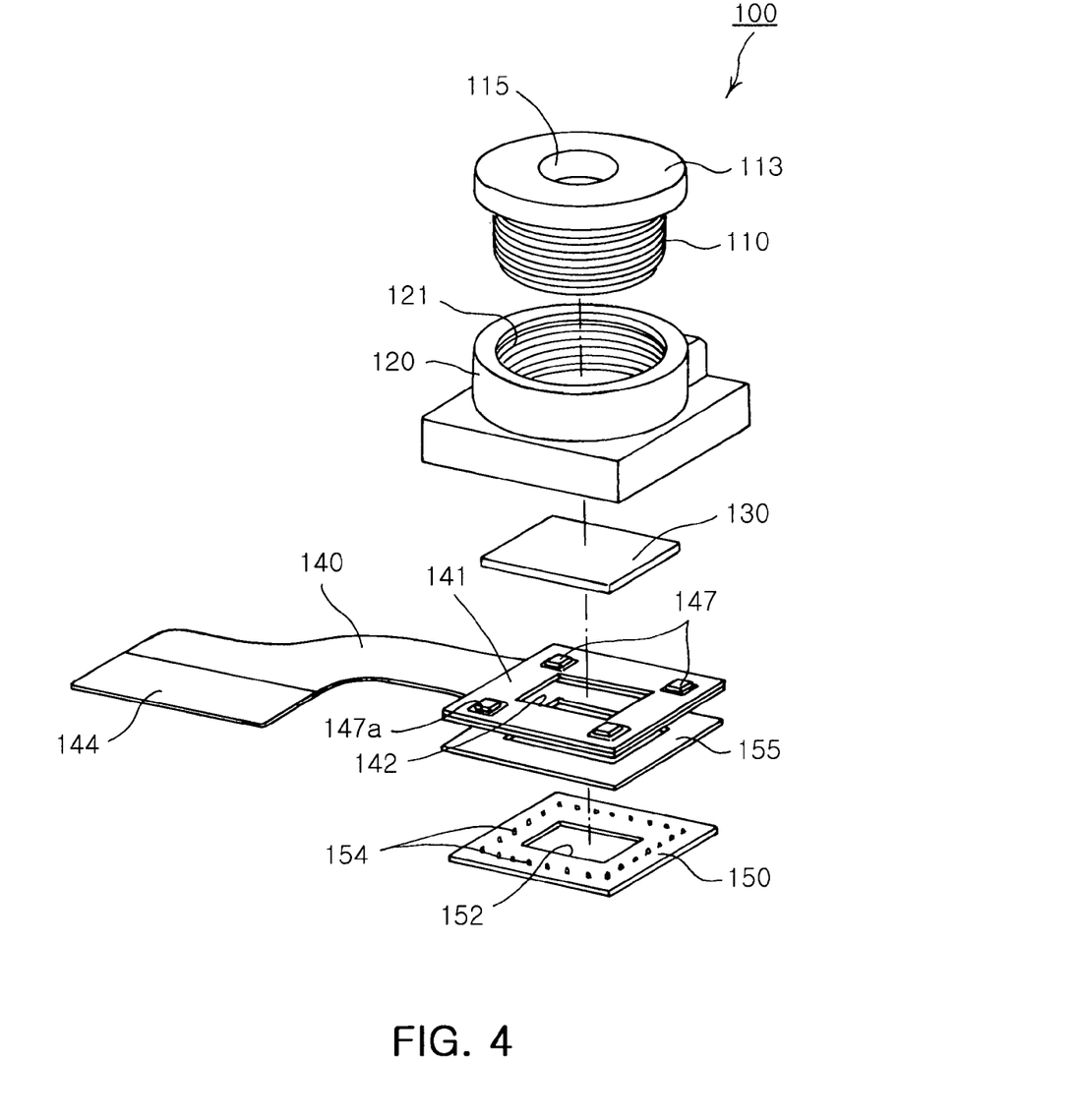
FIG. 4 is a longitudinal sectional view illustrating the camera module package according to an embodiment of the present invention.
Figure 5:
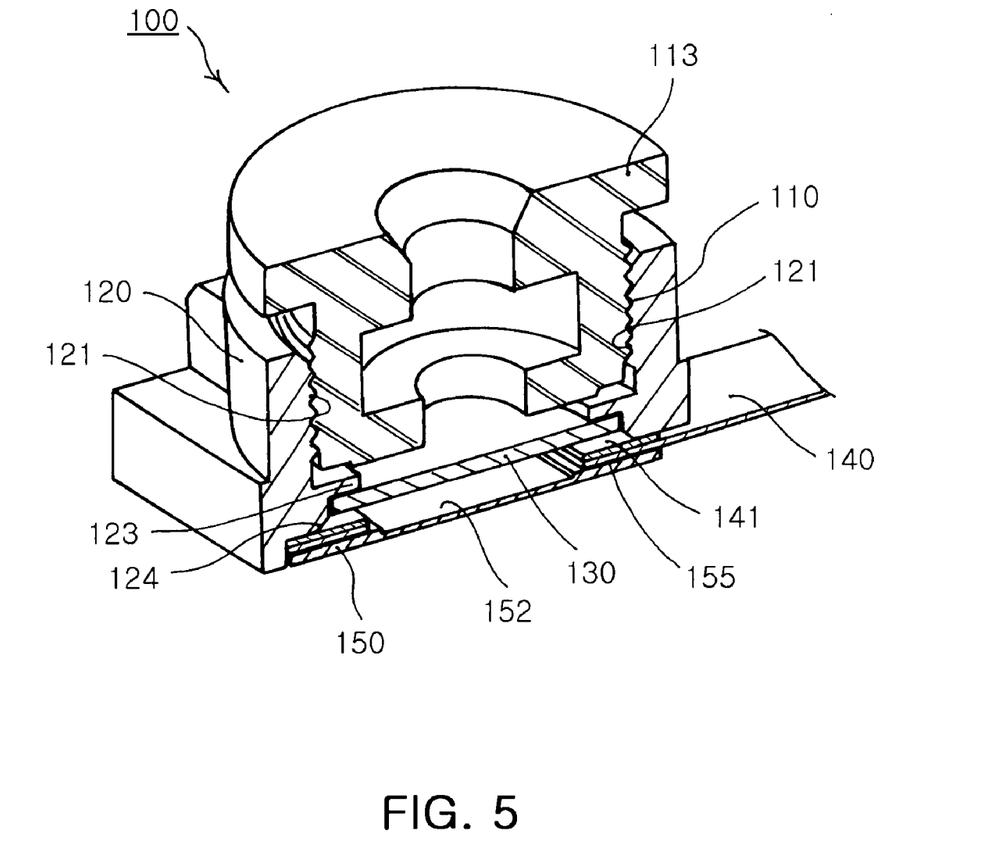
FIG. 5 is a longitudinal sectional view illustrating the center of the camera module package according to an embodiment of the present invention.

FIG. 3 is an exploded perspective view illustrating a camera module package according to the present invention, FIG. 4 is a longitudinal sectional view illustrating the camera module package according to the present invention, and FIG. 5 is a longitudinal sectional view illustrating the center of the camera module package according to the present invention.

As shown in FIGS. 3 to 5, the camera module package 100 according to the present invention includes a lens barrel 110, a housing 120, an Infrared (IR) filter 130, a board 140 and an image sensor 150.

The lens barrel 110 is a hollow having a predetermined dimension of inner space so that at least one lens is arranged therein along an optical axis.

The pluralities of lenses are disposed at predetermined intervals in the lens barrel 110 with spacers (not shown) provided between the lenses.

The lens barrel 110 has male threads formed on an outer surface thereof, and a cap 113 at an upper end thereof for fixedly housing the lenses arranged in an optical axis.

A predetermined dimension of light opening 115 is formed in a center of the cap 115, aligned with the center of the lens.

In addition, the housing 120 has an opening 121 formed through a central portion thereof, and has female threads formed on an inner surface thereof for housing the lens barrel 110. The female threads are threadly engaged with the male threads formed on an outer surface of the lens barrel 110.

With this thread engagement between the male and female threads, the lens barrel 110 can be disposed movable back and forth in an optical axis direction in the housing 120 fixed in its position when power is transmitted from an unillustrated drive source.

The housing 120 with the female threads has first and second inner steps 123 and 124 formed on inner surfaces thereof. The first inner step 123 is a stopper protruded from an inner surface and comes in contact with a lower end of the lens barrel 110 when the lens barrel 110 moves down.

The IR filter 130 is mounted on a lower surface of the first inner step 123 to filter ultraviolet rays included in the light incident through the lens barrel 110 or to prevent falling of scraps from the lens barrel 110 down to the image sensor 150. It is preferable that the IR filter 130 is made of a transparent material such as glass.

The second inner step 124 is a protruded part formed at a lower portion of the inner surface of the housing 120 than the first inner step 123, and the board 140 with the image sensor 150 flip-chip bonded thereon is bonded to a lower surface of the second inner step 124 at an outer peripheral portion thereof.

At this time, in order to facilitate the assembly process while preventing damage caused by the contact between the housing 120 and the board 140 during the bonding procedure of the housing 120 with the board 140, an interval t1 of 40 to 60 μm can be formed between an end surface of the board 140 and an inner surface of the housing 120.

Thereby, when the board 140 is inserted into the housing 120, the board 140 can be bonded to the second inner step 124 without the possibility of damage by obstruction.

The board 140 is a double-sided Flexible Printed Circuit Board (FPCB) with a pattern circuit printed on each of the sides. The board 140 has a window 142 at one side thereof inserted into (a box-like base of) the housing 120, and a connector 144 formed at the other side electrically connected to a display means (not shown) for displaying an image.

Figure 6:
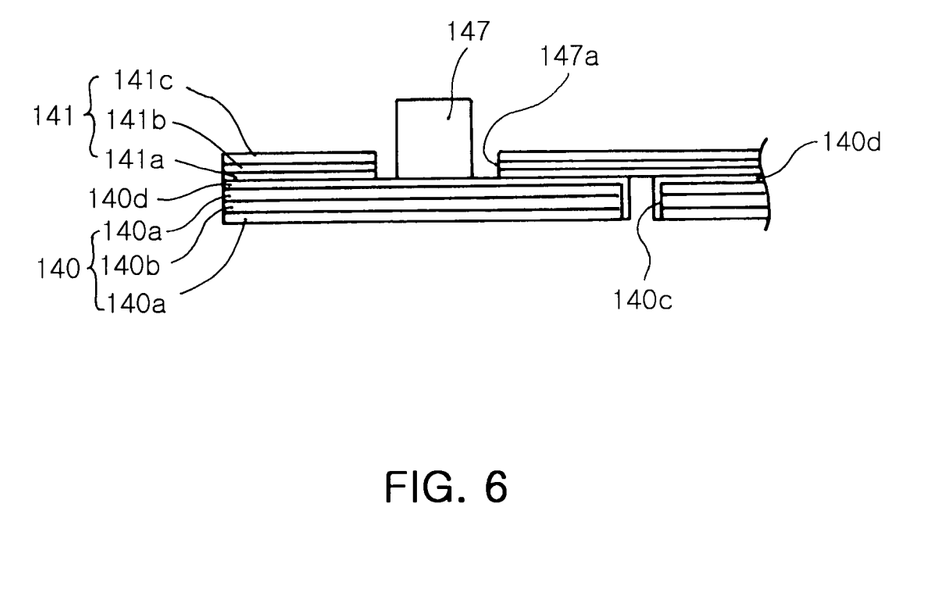
FIG. 6 is a longitudinal sectional view illustrating the board provided in the camera module package according to an embodiment of the present invention.

As shown in FIG. 6, the board 140 is composed of at least one conductive layer 140a and at least one non-conductive layer 140b alternating each other. The board 140 has a via 140c, which has a plating pattern 140d formed therein, for electrically connecting the conductive layers 140a. Also, in order to increase the rigidity of the board 140, at least one reinforcement material 141 is stacked on an upper surface of the board 140.

Here, the conductive layer 140a has a thickness of about 12 μm, and the non-conductive layer 140b has a thickness of about 25 μm. The plating pattern 140d, which is printed along a pattern set on the conductive layer 140a and formed in the via 140c, can be provided in a thickness of about 10 μm. However, the present invention is not limited to such thicknesses, and the number of layers and thicknesses can be variously modified according to the design conditions of the board.

A passive device 147 such as a multi-layer ceramic capacitor, which is electrically connected to the plating pattern 140d via a solder (not shown), is provided on an upper surface of the board 140.

The reinforcement material 141 is composed of an adhesive layer 141b, a cover layer 141a and a polyimide layer 141c formed subsequently in an order on an upper surface of the board 140.

Here, the cover layer 141a is provided in a thickness of about 27 to 38 μm, the adhesive layer 141b is provided in a thickness of about 25 μm, and the polyimide layer 141c is provided in a thickness of about 75 μm.

The reinforcement material 141 has a recess 147a exposing the plating pattern 140d printed on the upper surface of the board 140, and the passive device 147 is disposed in the terminal groove 147a and electrically connected to the board 140 via the solder.

Here, it is, preferable that the depth of the recess 147a is adjusted by varying the thickness of the reinforcement material 141 to such a degree that the solder is contained in the recess 147a as the solder is applied to cover the plating pattern 140d on the board 140.

The board 140 is bonded to a lower surface of the first inner step 124 formed on an inner surface of the housing 120 via an adhesive, with the center of the window 142 aligned with the optical axis.

Meanwhile, the image sensor 150 cut from a wafer has an image region 152 in a central portion thereof, and has a plurality of bump pads 154 on an outer peripheral portion thereof. The bump pads are electrically flip-chip bonded to a lower surface of the board 140 via an adhesive 155 such as Anisotropic Conductive Film (ACF) and Non-conductive Paste (NCP).

The board 140 and the image sensor 150 can be flip-chip bonded and electrically connected by placing connection terminals (not shown) formed on a lower surface of the board 140 in correspondence with the bump pads 154 formed on an upper surface of the image sensor 150, and heat-pressing the board 140 and the image sensor 150 by compressive force provided from a heat press and a heat source (not shown).

Thereby, the conductive particles connect each of the connection terminals of the board 140 with a corresponding one of the bump pads of the image sensor 150 to exhibit anisotropic conductivity, thereby forming electrical as well as mechanical connection between the terminals.

In the meantime, as the board 140 and the image sensor 150 are heat-pressed during the flip-chip bonding, the adhesive 155 spreads outward. Thus, in order to prevent the adhesive from staining the inner surface of the housing 120 or from further spreading over the outermost peripheral portions of the board 140, it is preferable that the outer peripheral portion of the image sensor 150 is positioned more inward than the outer peripheral portion of the board 140. Therefore, the outer peripheral portion of the board 140 has an interval t2 of about 90 to 110 μm from the outer peripheral portion of the image sensor 150.

A process of producing the camera module with above-described configuration involves preparing the housing, which has the female threads formed in the opening 121 thereof for thread engagement with the lens barrel 110 containing at least one lens therein, and which has the first and second inner steps 123 and 124 formed on an inner surface thereof.

The IR filter 130, which is a transparent medium, is mounted on a lower surface of the first inner step 123 of the housing 120, perpendicular to the optical axis.

In addition, the bump pads 154 of the image sensor 150 are flip-chip bonded to a lower surface of the side of the board 140, which has the window 142 formed therethrough and is inserted into the housing 120, by an adhesive such as ACF or NCP, thereby electrically connecting the image sensor 150 to the board 140.

Here, since the outer peripheral portion of the image sensor 150 is positioned at an interval t2 from the outer peripheral portion of the board 140, the adhesive is prevented from spreading over the peripheral portion of the board 140 during the heat pressing.

At this time, the image region 152 of the image sensor 150 should be aligned with the window 142 of the board 140.

In the meantime, the board 140 with a plurality of passive devices 147 mounted on an upper surface thereof and at least one reinforcement material 141 stacked thereon to improve rigidity thereof can be assembled to the housing 120 as follows. That is, with the IR filter 130 placed in correspondence with the window 142, the outer peripheral portion of the board 140 can be bonded to a lower surface of the second inner step 124 of the housing 120 by an adhesive.

At this time, since the outer peripheral portion of the board 140 inserted into a lower part of the housing 120 is spaced apart at a predetermined interval from the inner surface of the housing 120, the insertion of the board 140 for bonding to the second inner step 124 of the housing 120 can be done without any obstruction.

In addition, even if the board 140 comes in contact with the inner surface of the housing 120 as it is inserted, it has sufficient rigidity with the reinforcement material stacked thereon, and thus the outer peripheral portion of the board can be prevented from being damaged by the impact caused by such a contact.

The lens barrel having male threads formed on an outer surface thereof and having at least one lens contained therein is threadly engaged with the female threads of the housing 120 to complete the camera module package 100.

According to the present invention as set forth above, at least one reinforcement material is stacked on an upper surface of the board to improve the rigidity of the board, thereby preventing the board from being damaged by the impacts caused from the contacts between the board and the housing as the board is fixedly inserted into the housing.

Furthermore, the outer peripheral portion of the image sensor is placed more inward than the outer peripheral portion of the board, thereby preventing the adhesive from spreading outward and over the outer peripheral portion of the board during the flip-chip bonding between the board and the image sensor, and in turn preventing contamination of the module.

While the present invention has been shown and described in connection with the exemplary embodiments, it will be apparent to those skilled in the art that modifications and variations can be made without departing from the spirit and scope of the invention as defined by the appended claims.

What is claimed is:

1. A camera module package comprising:
   a housing having first and second inner steps, the first inner step protruding from an inner surface of the housing and the second inner step disposed at a lower side of the first inner step and stepped with relation to the first inner step;
   a lens barrel assembled to the housing and having at least one lens therein;
   at least one infrared filter disposed in the first inner step of the housing;
   a board disposed in the second inner step of the housing with at least one reinforcement material mounted thereon and at least one passive device mounted thereon, wherein an interval t1 is formed between an end side surface of the board and the inner surface of the housing; and
   an image sensor inserted into the housing and attached to a lower surface of the board with an image region thereof exposed through a window formed at a side of the board, wherein an interval t2 is formed between an end side surface of the image sensor and the end side surface of the board, the interval t2 being larger than the interval t1,
   wherein the housing includes an inner surface correspondent with an end surface of the board,
   wherein the board is inserted into a space formed in the inner surface for aligning a center of the window with an optical axis, and
   wherein the reinforcement material has a recess formed therein, and the passive device is mounted on an exposed plating pattern by a solder inside the recess.

2. The camera module package according to claim 1, wherein the reinforcement material comprises an adhesive layer, a cover layer and a polyimide layer formed subsequently in an order on an upper surface of the board.

3. The camera module package according to claim 1, wherein a depth of the recess is adjusted by varying a thickness of the reinforcement material to such a degree that the solder is contained in the recess as the solder is applied to cover the plating pattern on the board during solder masking.

4. The camera module package according to claim 1, wherein an inner surface of the housing is spaced with an interval from an end surface of the board.

5. The camera module package according to claim 1, wherein an outer peripheral portion of the image sensor is positioned more inward than an outer peripheral portion of the board.

\* \* \* \* \*